United States Patent [19]
Kelkar et al.

[11] Patent Number: 6,001,723
[45] Date of Patent: Dec. 14, 1999

[54] APPLICATION OF WIRE BOND LOOP AS INTEGRATED CIRCUIT PACKAGE COMPONENT INTERCONNECT

[75] Inventors: Nikhil Kelkar, Santa Clara; Jaime A. Bayan, Palo Alto, both of Calif.

[73] Assignee: National Semiconductor Corporation, Santa Clara, Calif.

[21] Appl. No.: 08/998,442

[22] Filed: Dec. 24, 1997

[51] Int. Cl.[6] .................................................. H01L 21/44
[52] U.S. Cl. .......................... 438/612; 438/615; 438/617
[58] Field of Search .................... 438/106, 597, 438/612, 613, 615, 617, 110, 113, 127

[56] References Cited

U.S. PATENT DOCUMENTS

| | | | |
|---|---|---|---|
| 3,310,858 | 3/1967 | Johnson | 438/106 |
| 3,487,272 | 12/1969 | Siebertz et al. | 438/106 |
| 4,631,805 | 12/1986 | Olsen et al. | 438/612 |
| 5,014,111 | 5/1991 | Tsuda et al. | 438/617 |
| 5,124,277 | 6/1992 | Tsumura | 438/617 |
| 5,302,550 | 4/1994 | Hirota et al. | 438/612 |
| 5,705,425 | 1/1998 | Miura et al. | 438/106 |
| 5,710,068 | 1/1998 | Hill | 438/171 |
| 5,723,364 | 3/1998 | Nakamura et al. | 438/612 |
| 5,773,311 | 6/1998 | Cullinan et al. | 438/617 |
| 5,830,800 | 11/1998 | Lin | 438/612 |
| 5,874,354 | 2/1999 | Heitzer et al. | 438/612 |
| 5,877,033 | 3/1999 | Matern | 438/615 |

*Primary Examiner*—Richard Booth
*Assistant Examiner*—Christopher Latin
*Attorney, Agent, or Firm*—Beyer & Weaver, LLP

[57] ABSTRACT

A method of forming an interconnection contact for integrated circuit package components includes providing an integrated circuit package component having a contact pad on which the interconnecting contact is to be formed. The interconnecting contact is formed by forming at least a portion of a bonding wire loop connected to the contact pad. A first end of a bonding wire is connected to the contact pad. The bonding wire loop includes a wire portion extending outwardly from the contact pad. The portion of the bonding wire loop forms the interconnection contact for electrically connecting the integrated circuit package component to other electrical devices. In one embodiment, a second end of the bonding wire loop is connected to the same contact pad that the first end of the bonding wire loop is connected to. In another embodiment, a second end of the bonding wire loop is connected to another contact pad. The integrated circuit package component may be an integrated circuit die or an interconnecting device such as an interconnecting substrate for interconnecting other integrated circuit package components or for connecting the integrated circuit package to other electrical elements. An encapsulating material may be used to encapsulate the particular surface of the integrated circuit package component, the contact pad, and portions of the bonding wire loop.

6 Claims, 3 Drawing Sheets

६,००१,७२३

APPLICATION OF WIRE BOND LOOP AS INTEGRATED CIRCUIT PACKAGE COMPONENT INTERCONNECT

BACKGROUND OF THE INVENTION

The present invention relates generally to integrated circuit (IC) packages and more specifically to methods of forming interconnecting contacts for integrated circuit package components.

In the IC packaging industry, there is continuous pressure to reduce the cost of packaging ICs. To accomplish this, a wide variety of package designs and assembly methods have been developed. One of the currently used techniques for producing IC packages is referred to as flip chip packaging. Flip chip packages are typically produced by attaching solder balls or solder columns to input/output terminal pads on the top surface of an integrated circuit die. The solder balls or columns form interconnecting contacts that are used to connect the die to other electrical elements such as a printed circuit board. During the assembly of the flip chip package onto a substrate such as a printed circuit board, the integrated circuit die is flipped upside down such that the solder balls or columns are facing the substrate and is then attached to the substrate. FIG. 1 is a cross sectional view illustrating a typical flip chip package, designated by reference numeral 10, that is attached to a substrate material such as printed circuit board 12.

As shown in FIG. 1, flip chip package 10 includes an integrated circuit die 14 and a plurality of solder ball or solder column interconnecting contacts 16. Interconnecting contacts 16 are attached to associated input/output terminal pads 18 formed on a surface 20 of integrated circuit die 14. Interconnecting contacts 16 are used to electrically connect integrated circuit die 14 to a substrate such as printed circuit board 12.

Because interconnecting contacts 16 are rigid columns or solder balls, these interconnecting contacts form rigid connections between integrated circuit die 14 and printed circuit board 12. These rigid connections are susceptible to cracking or separation due to vibration and/or thermo-mechanical stresses placed on the finished printed circuit board. In order to improve the reliability of the mechanical connection between the flip chip package 10 and the printed circuit board 12, an epoxy material 22 or other such adhesive material is used to underfill flip chip package 10 and adhere package 10 to printed circuit board 12 after the package is assembled onto the printed circuit board. This underfill process is an extra step in the assembly process and adds to the cost of assembling the system using this type of flip chip package.

In order to overcome the above described problem of the rigid contacts and provide an alternative method of forming interconnecting contacts, it is desirable to provide a flexible interconnecting contact for a flip chip package and other interconnection applications. Accordingly, the present invention provides methods of forming flexible interconnecting contacts on integrated circuit package components such as the integrated circuit die of a flip chip package, and eliminates the need for underfill material.

SUMMARY OF THE INVENTION

As will be described in more detail hereinafter, a method of forming an interconnection contact for an integrated circuit package component is herein disclosed. The method includes providing an integrated circuit package component including a contact pad on which the interconnecting contact is to be formed. A bonding wire loop is formed by connecting a first end of a bonding wire to the contact pad and connecting a second end of the bonding wire to a certain point on the integrated circuit package component. The bonding wire loop forms the interconnection contact for electrically connecting the integrated circuit package component to other electrical devices.

In one embodiment, the bonding wire loop is formed with both the first and the second ends of the bonding wire connected to the same contact pad. In one version of this embodiment, the first end of the bonding wire loop is connected to the contact pad by bonding the first end of the bonding wire loop to the contact pad. The second end of the bonding wire loop is then connected to the first end of the bonding wire loop by bonding the second end of the bonding wire loop to a point on the first end of the bonding wire loop. Alternatively, the integrated circuit package component may include a plurality of contact pads and the bonding wire loop may be formed with the first end of the bonding wire connected to a first contact pad and the second end of the bonding wire connected to a second contact pad. The integrated circuit package component may be an integrated circuit die or any other integrated circuit package component such as an interconnecting substrate for interconnecting integrated circuit package components.

In another embodiment, the contact pad is located on a particular surface of the integrated circuit package component the method further includes encapsulating at least portions of the particular surface of the integrated circuit package component, the contact pad, and portions of the bonding wire loop with an encapsulating material.

In another embodiment, the integrated circuit package component is an overall panel or wafer including an array of individual integrated circuit package components such as individual integrated circuit package substrates or individual integrated circuit die. In this embodiment, each adjacent individual integrated circuit package component of the overall panel has a plurality of contact pads located on a particular surface of the overall panel. A plurality of bonding wire loops are formed by connecting a first end of each bonding wire to a first contact pad on one of the individual integrated circuit package components and connecting a second end of each bonding wire to an associated contact pad on another one of the individual integrated circuit package components. After forming the plurality of bonding wire loops, the particular surface of the overall panel, the contact pads, and portions of the plurality of bonding wire loops are encapsulated with an encapsulating material. The individual integrated circuit package components are then singulated by cutting between each individual integrated circuit package component such that the plurality of bonding wire loops are cut leaving portions of the plurality of bonding wire loops connected to each individual integrated circuit package component. The portions of the plurality of bonding wire loops that remain connected to each individual integrated circuit package form the interconnection contacts for electrically connecting the individual integrated circuit package components to other electrical devices.

An integrated circuit package and device for use in an integrated circuit package are also disclosed. The integrated circuit package and the device include an integrated circuit package component having a contact pad. The integrated circuit package and the device also include at least a portion of a bonding wire loop having a first end that is connected to the contact pad and a wire portion that extends outwardly from the contact pad thereby forming the portion of the bonding wire loop. The portion of the bonding wire loop forms an interconnection contact for interconnecting the integrated circuit package component to other components. The integrated circuit package component may be an integrated circuit die, an interconnecting substrate for interconnecting other components, or any other integrated circuit package component.

In one embodiment, a second end of the bonding wire loop is connected to a certain point on the integrated circuit package component thereby forming the bonding wire loop. In one version of this embodiment, both the first and the second ends of the bonding wire loop are connected to the contact pad. The first end of the bonding wire loop may be connected to the contact pad with the second end of the bonding wire loop being connected to a point on the first end of the bonding wire loop. In another version of this embodiment, the integrated circuit package component includes a plurality of contact pads and the first end of the bonding wire loop is connected to a first contact pad and the second end of the bonding wire loop is connected to a second contact pad.

In another embodiment, the first end of the bonding wire loop is connected to the contact pad located on a particular surface of the integrated circuit package component. In this embodiment, an encapsulating material may cover at least portions of the particular surface of the integrated circuit package component, the contact pad, and portions of the bonding wire loop.

BRIEF DESCRIPTION OF THE DRAWINGS

The features of the present invention may best be understood by reference to the following description of the presently preferred embodiments together with the accompanying drawings.

DETAILED DESCRIPTION OF THE PREFERRED EMBODIMENTS

An invention is herein described for providing methods of forming interconnecting contacts for integrated circuit package components. In the following description, numerous specific details are set forth in order to provide a thorough understanding of the present invention. However, in view of this description, it will be obvious to one skilled in the art that the present invention may be embodied in a wide variety of specific configurations. Also, well known integrated circuit package manufacturing processes such as wire bonding processes, integrated circuit package encapsulating or molding processes, singulating process, and other such conventional integrated circuit manufacturing processes will not be described in detail in order not to unnecessarily obscure the present invention.

Figure 1:
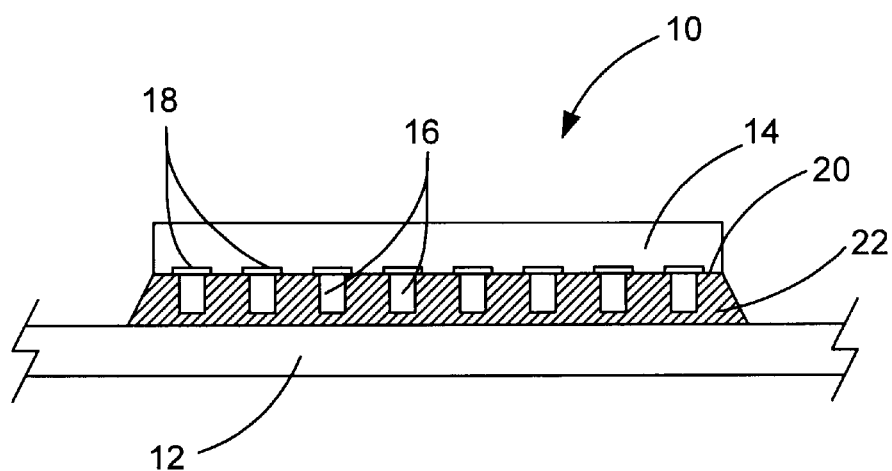
FIG. 1 is a diagrammatic cross sectional view of a prior art flip chip package.
Figure 2:
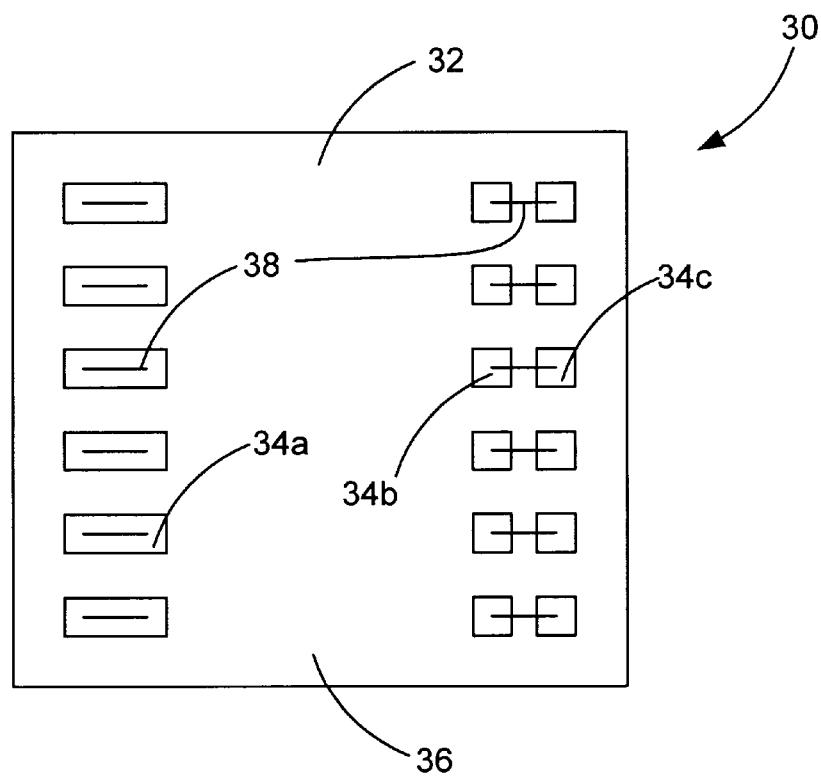
FIG. 2 is a diagrammatic plan view of an integrated circuit package component in accordance with the invention including contacts formed from bonding wire loops.

Referring initially to FIG. 2, an integrated circuit package device 30 manufactured using one embodiment of a method in accordance with the invention will initially be described. Device 30 includes an integrated circuit package component 32. Integrated circuit package component 32 may be any integrated circuit package component on which an interconnecting contact is to be formed. This includes, but is not limited to, integrated circuit die, interconnecting substrates for interconnecting other integrated circuit package components, and substrates for connecting an overall integrated circuit package to other electrical elements. In the case of a flip chip package similar the one described above with reference to FIG. 1, integrated circuit package component 32 would take the form of an integrated circuit die.

Integrated circuit component 32 includes one or more contact pads 34 on which the interconnecting contact or contacts are to be formed. Typically, contact pads 34 are located around the peripheral edges of a particular surface 36 of component 32. However, this is not a requirement of the invention. Instead, component 32 may include any number of contact pads arranged in any desired configuration on component 32. In the case of a flip chip package, component 32 would be an integrated circuit die including a plurality of input/output terminal pads that act as contact pads 34.

Figure 3A:
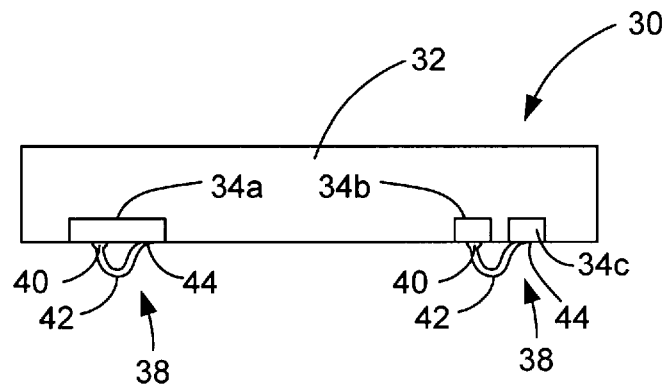
FIG. 3A is a diagrammatic cross sectional view of the integrated circuit package component of FIG. 2.
Figure 3B:
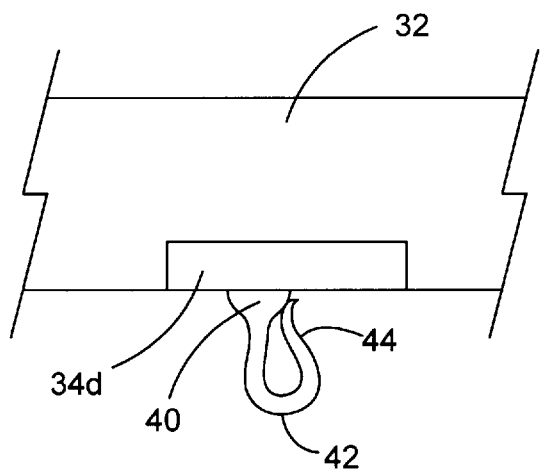
FIG. 3B is a diagrammatic cross sectional view of another embodiment of contacts formed from a bonding wire loop.

In accordance with the invention, interconnecting contacts 38 are formed on contact pads 34 by forming bonding wire loops that make up interconnecting contacts 38. As shown best in FIG. 3A, which is a cross section view of device 30, each interconnecting contact 38 is formed by connecting a first end 40 of a bonding wire 42 to one of contact pads 34. A second end of bonding wire 42, indicated by end 44, is attached to another point on component 32 thereby forming a bonding wire loop that makes up interconnecting contact 38. As illustrated in FIG. 3A, second end 44 of bonding wire 42 may be attached to the same contact pad as first end 40 as shown on contact pad 34a. Alternatively, first end 40 of bonding wire 42 may be attached to a first contact pad as indicated at contact pad 34b in FIG. 3A and second end 44 of bonding wire 42 may be attached to a second contact pad as indicated at contact pad 34c in FIG. 3A. In still another variation, which is illustrated in FIG. 3B, first end 40 of bonding wire loop 42 may be attached to a first contact pad 34d. Second end 44 of bonding wire loop 42 may then be attached to a point on first end 40 of bonding wire loop 42 thereby forming bonding wire loop 42.

In the case of a flip chip package designed in accordance with the invention, integrated circuit package component 32 takes the form of an integrated circuit die 32 and contact pads 34 take the form of a plurality of input/output terminal pads 34. As described above, interconnecting contacts 38 are each formed by attaching a first end of each bonding wire 42 to one of the input/output terminal pads 34 and attaching the other end of each bonding wire 42 to another point on integrated circuit die 32. Again, the second end of the bonding wire may be attached to the same input/output terminal pad as the first end of the bonding wire. If this is the case, the input/output terminal pad may be an enlarged terminal pad which provides sufficient space for attaching the two ends of the bonding wire as indicated by pad 34a in FIG. 3A. Alternatively, the second end of the bonding wire may be attached to an associated second input/output terminal pad. In this situation, the integrated circuit die 32 would have a pair of input/output terminal pads associated with each desired interconnecting contact as illustrated by pads 34b and 34c in FIG. 3A. Additionally, as illustrated in FIG. 3B, the second end of the bonding wire may be bonded to some point on the first end of the bonding wire thereby forming the bonding wire loop.

The bonding wire loops that make up the interconnecting contacts may be formed using any conventional wire bonding equipment and any conventional wire bonding techniques. These techniques are well known to those skilled in the art and include, but are not limited to, ball bonding, stitch bonding or wedge bonding, and many other known wire bonding techniques. For example, as shown in FIG. 3, the first end 40 of bonding wire 42 may be ball bonded to contact 34a and the second end 44 may be stitch bonded to contact 34a. Alternatively, both ends of the bonding wire may be stitch bonded as illustrated by the bonding wire connected to contact pads 34b and 34c of FIG. 3. Although these specific examples are given, it should be understood that the present invention would equally apply regardless of the specific attaching technique used to connect the bonding wire to the contact pads.

The bonding wire loops may be formed from any conventional bonding wire material including but not limited to gold, copper, any other bonding wire material including various alloys. However, in one embodiment, the bonding wires are formed from copper. The use of copper for the bonding wire loop contacts reduces the chances of intermetallic growth which may occur at the junction where the bonding wire loop contact is attached to other electrical elements such as a printed circuit board.

It should be understood that the bonding wires may be any appropriate size and still remain within the scope of the invention. Currently, bonding wires used for conventional bonding wire applications are typically 1 mil in diameter and equipment for producing bonding wires of this size are readily available. However, in the past, 2 mil diameter bonding wires were more common and equipment for producing bonding wires of this larger diameter is also readily available. In fact, in high power applications, the larger diameter bonding wires are still often utilized. Since the bonding wire loops of the present invention are utilized as contacts for connecting the integrated circuit package component to other electrical elements, the larger diameter bonding wires are generally preferable in order to provide stronger contacts. However, as stated above, this is not a requirement.

Although the bonding wires described above have been described as having a diameter which suggests the bonding wires are circular in cross section, this is not a requirement. Instead, it should be understood that the bonding wires may have any cross sectional shape and still remain within the scope of the invention. These cross sectional shapes include elliptical cross sections, flattened ribbon like cross sections, square cross sections, or any other desired cross sectional shape.

The bonding wire interconnecting contacts of the present invention provide significant advantages over other prior art methods of forming interconnecting contacts. First, since conventional wire bonding equipment is used to form the interconnecting contacts, wire bonding equipment that is commonly used for many other integrated circuit package production steps may also be used to form the interconnecting contacts. This leverages the use of the wire bonding equipment and eliminates the need for special equipment to form the interconnecting contacts. Also, the bonding wire interconnecting contacts of the invention provide flexible contacts that are capable of flexing and absorbing mechanical shock. In the case of a flip chip package that uses these novel bonding wire interconnecting contacts, the flexibility of the contacts may eliminate the requirement for the underfill process described in the background for the conventional flip chip configuration that uses rigid solder columns or solder balls.

Figure 4:
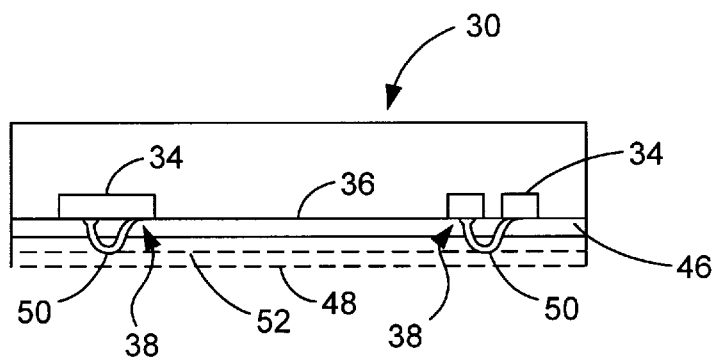
FIG. 4 is a diagrammatic cross sectional view of the integrated circuit package component of FIG. 2 including an encapsulating material covering portions of the contacts formed from bonding wire loops.

In an additional process step, portions of the bonding wire interconnecting contacts 38 may be partially or entirely covered with an encapsulating material 46 as illustrated in FIG. 4. Encapsulating material 46 is molded over surface 36 of integrated circuit package component 32 such that it covers surface 36 of integrated circuit package component 32, contact pads 34, and portions of bonding wire interconnecting contacts 38. This encapsulating material covers and protects the contact pads and the bonding wire loops at the attachment points of the bonding wires to the contact pads. Depending on the requirements of the application in which the completed device is to be used, any desired portion of the bonding wire interconnecting contacts may be covered with the encapsulating material.

In one embodiment illustrated in FIG. 4, encapsulating material 46 covers only part of each of bonding wire interconnecting contacts 38. This leaves a portion of each of bonding wire interconnecting contacts 38 exposed for electrically connecting the device to other electrical elements. As described above, one advantage of this approach is that the exposed portions of the bonding wire interconnecting contacts are flexible and are capable of flexing and absorbing mechanical shock. In the case of a flip chip package, this flexibility of the contacts may eliminate the requirement for the underfill process as described above.

In another embodiment, all of the bonding wire interconnecting contacts 38 are completely covered with encapsulating material 46 as indicated by dashed line 48 in FIG. 4. In this embodiment, encapsulating material 46 is then milled or ground down to a point at which only a lowermost portion 50 of each of bonding wire interconnecting contacts 38 begins to be exposed. This point is indicated by dashed line 52 in FIG. 4. With this configuration, device 30 may be used as a surface mount device that may be attached to a printed circuit board or other electrical element having contact points formed on the printed circuit board or other element that match up with the exposed portions of interconnecting contacts 38 of device 30. With a suitable encapsulating material, this method provides a flexible package that can withstand vibration and other thermo-mechanical stresses on the interconnections. This eliminates the need for a traditional additional underfill process and saves the cost and time associated with the extra underfill process.

Figure 5:
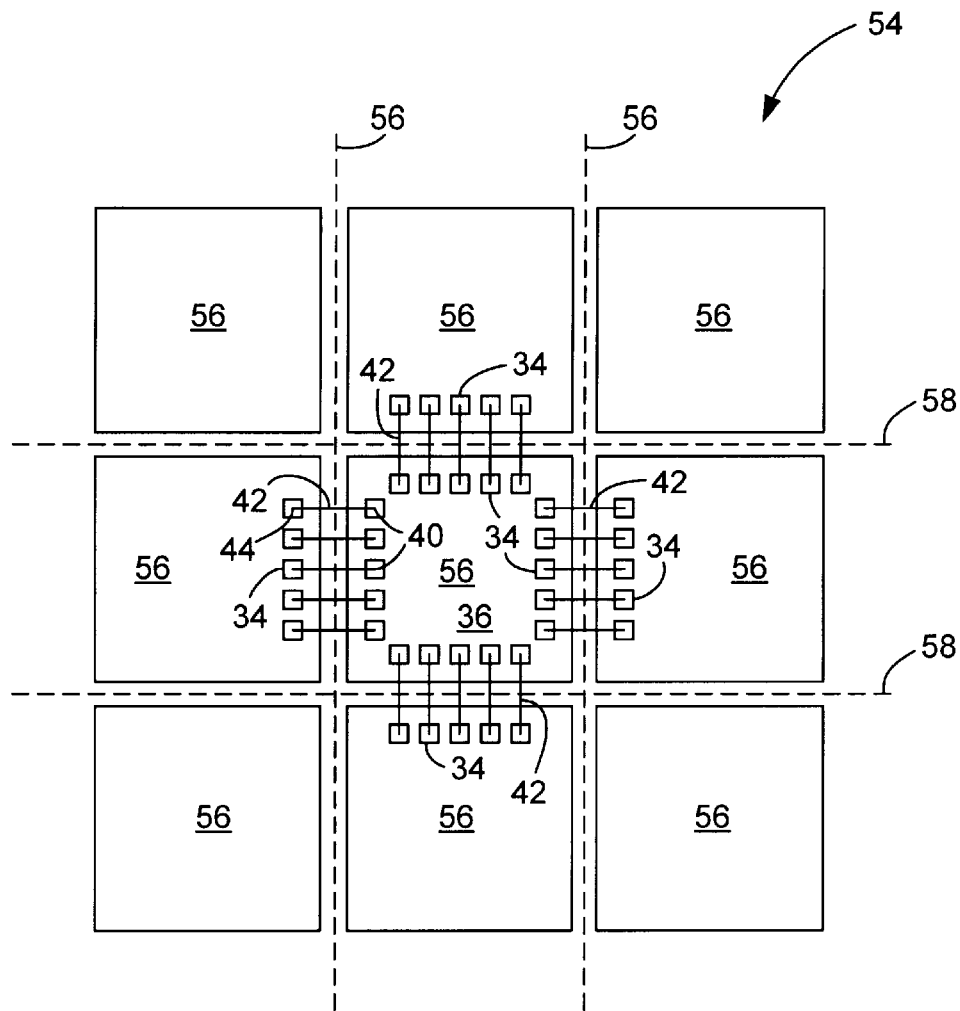
FIG. 5 is a diagrammatic plan view of a panel of integrated circuit package components in accordance with the invention including contacts formed from bonding wire loops.
Figure 6:
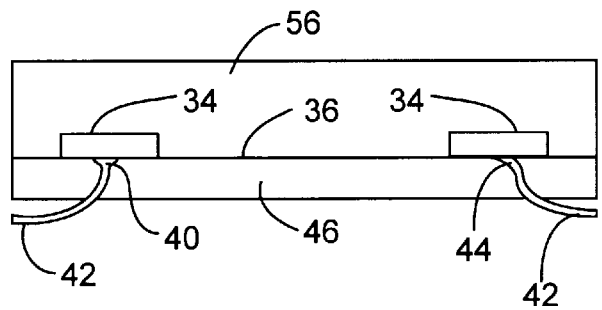
FIG. 6 is a diagrammatic cross sectional view of one of the integrated circuit package components of FIG. 5.

Although the above described embodiments utilize the entire bonding wire loop as the contact for the integrated circuit package component, this is not a requirement. Instead, as illustrated in FIGS. 5 and 6, the bonding wire loops may be cut so that only a portion of each of the bonding wire loops forms the interconnecting contact for the integrated circuit package component. As will be described in more detail below, FIG. 5 illustrates a plan view of an overall panel including an array of individual integrated circuit package components and FIG. 6 illustrates a cross sectional view of one of these integrated circuit package components after it has been singulated.

Referring now to FIGS. 5 and 6, another embodiment of a method of producing a contact for an integrated circuit package component will be described. In this embodiment, the integrated circuit package component is a panel or wafer 54 including an array of individual integrated circuit package components 56 such as an array of individual integrated circuit die or an array of individual integrated circuit package substrates. Each individual integrated circuit package component 56 includes a plurality of contact pads 34 located on a particular surface 36 of overall panel 54 in a similar manner to that described above for the previous embodiments. As also described above, a plurality of bonding wire loops 42 are formed which will act as interconnecting contacts for integrated circuit package components 56. However, in this embodiment, bonding wire loops 42 are formed with their first end 40 connected to one of the contact pads on a first one of the integrated circuit package components and their second ends 44 connected to an associated contact pad of an adjacent integrated circuit package component.

After forming the plurality of bonding wire loops 42, surface 36 of the overall panel, contact pads 34, and portions of the plurality of bonding wire loops 42 are encapsulated with an encapsulating material 46 as best shown in FIG. 6. Individual integrated circuit package components 56 are then singulated by cutting between each individual integrated circuit package component as indicated by dashed lines 58 in FIG. 5. When the individual integrated circuit package components are singulated, the plurality of bonding wire loops 42 are also cut leaving only portions of the plurality of bonding wire loops 42 connected to each individual integrated circuit package component 56. The portions of bonding wire loops 42 that remain connected to each individual integrated circuit package form interconnection contacts for electrically connecting the individual integrated circuit package components to other electrical devices.

Although only a few specific embodiments of devices and methods in accordance with the invention have been described above in detail, it is to be understood that the devices and methods of the present invention may be embodied in a wide variety of alternative forms and still remain within the scope of the invention. Any of these various embodiments would equally fall within the scope of the invention so long as at least a portion of a bonding wire loop is used to form an interconnecting contact for interconnecting an integrated circuit package component to other components. Also, although the integrated circuit package components have been described with their various features having particular respective orientations, it should be understood that the present invention may take on a wide variety of specific configurations with the various features being located in a wide variety of positions and mutual orientations and still remain within the scope of the present invention. Therefore, the present examples are to be considered as illustrative and not restrictive, and the invention is not to be limited to the details given herein, but may be modified within the scope of the appended claims.

What is claimed is:

1. A method of forming an interconnection contact on an integrated circuit die having a plurality of bond pads on a particular surface of the die, the method comprising the steps of:

forming a bonding wire loop by connecting first and second ends of a bonding wire to associated bond pads on the integrated circuit component;

encapsulating at least portions of the particular surface of the integrated circuit package die, the contact pads, and portions of the bonding wire loop with an encapsulating material leaving a portion of the bonding wire loop exposed such that the bonding wire loop forms an interconnection contact for electrically connecting the die to other electrical components.

2. A method according to claim 1 wherein both the first and the second ends of the bonding wire are connected to the same contact pad.

3. A method according to claim 1 wherein the first end of the bonding wire is connected to a first contact pad and the second end of the bonding wire is connected to a second contact pad.

4. A method of forming an interconnection contact for an integrated circuit package component, the method comprising:

forming a bonding wire loop by connecting a first end of a bonding wire to the contact pad and connecting a second end of the bonding wire to a certain point on the integrated circuit package component, the bonding wire loop forming the interconnection contact for electrically connecting the integrated circuit package component to other electrical devices, such as a substrate, providing an overall panel including an array of individual integrated circuit package components with each individual integrated circuit package component having a plurality of contact pads located on a particular surface of the overall panel;

forming a plurality of bonding wire loops with a first end of each loop connected to an associated contact pad on a first one of the individual integrated circuit package components and a second end of each loop connected to an associated contact pad on another one of the individual integrated circuit package components;

encapsulating at least portions of the particular surface of the overall panel, the plurality of contact pads, and portions of the plurality of bonding wire loops; and singulating the individual integrated circuit package components by cutting between each individual integrated circuit package component such that the plurality of bonding wire loops are cut thereby leaving portions of the plurality of bonding wire loops connected to each individual integrated circuit package component, the portions of the plurality of bonding wire loops that remain connected to each individual integrated circuit package forming the interconnection contacts for electrically connecting the individual integrated circuit package components to other electrical devices.

5. A method according to claim 4 wherein the panel including an array of individual integrated circuit package components is a wafer including an array of integrated circuit die.

6. A method according to claim 4 wherein the panel including an array of individual integrated circuit package components is a panel including an array of individual integrated circuit package substrates.

* * * * *